United States Patent
Tsai et al.

(10) Patent No.: US 10,153,156 B2
(45) Date of Patent: Dec. 11, 2018

(54) PLASMA ENHANCED ATOMIC LAYER DEPOSITION

(71) Applicant: Taiwan Semiconductor Manufacturing Co., Ltd., Hsin-Chu (TW)

(72) Inventors: Chun Hsiung Tsai, Xinpu Township (TW); Kuo-Feng Yu, Zhudong Township (TW); Yuh-Ta Fan, Shin Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/433,739

(22) Filed: Feb. 15, 2017

(65) Prior Publication Data
US 2018/0174820 A1 Jun. 21, 2018

Related U.S. Application Data

(60) Provisional application No. 62/434,975, filed on Dec. 15, 2016.

(51) Int. Cl.
| | |
|---|---|
| *H01L 21/02* | (2006.01) |
| *C23C 16/455* | (2006.01) |
| *C23C 16/52* | (2006.01) |
| *C23C 16/44* | (2006.01) |

(52) U.S. Cl.
CPC ...... *H01L 21/0228* (2013.01); *C23C 16/4408* (2013.01); *C23C 16/45527* (2013.01); *C23C 16/45536* (2013.01); *C23C 16/45544* (2013.01); *C23C 16/52* (2013.01); *H01L 21/0217* (2013.01); *H01L 21/02274* (2013.01); *H01L 21/02617* (2013.01)

(58) Field of Classification Search
CPC .......... H01L 21/02274; H01L 21/0228; H01L 21/28556; C23C 16/45527; C23C 16/45536; C23C 16/45542
See application file for complete search history.

(56) References Cited

U.S. PATENT DOCUMENTS

| | | | |
|---|---|---|---|
| 9,865,455 B1 * | 1/2018 | Sims | H01L 21/02274 |
| 2018/0068844 A1 * | 3/2018 | Chen | C23C 16/045 |

* cited by examiner

*Primary Examiner* — Selim Ahmed
*Assistant Examiner* — Evan Clinton
(74) *Attorney, Agent, or Firm* — Haynes and Boone, LLP

(57) ABSTRACT

According to one example, a process includes performing a first plurality of layer deposition cycles of a deposition process on a substrate, and after performing the first plurality of layer deposition cycles, performing a plasma enhanced layer deposition cycle comprising a plasma treatment process. The first plurality of layer deposition cycles are performed without a plasma treatment process.

18 Claims, 7 Drawing Sheets

PLASMA ENHANCED ATOMIC LAYER DEPOSITION

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Semiconductor device fabrication includes many different processes. One such process is an Atomic Layer Deposition Process (ALD). An ALD process involves sequentially and alternatingly applying different materials to form a thin film layer on a substrate positioned within a deposition chamber. Particularly, the ALD process involves a number of cycles. Each cycle involves a deposition process and a purge process. The deposition processes for a set of cycles alternate between different types of materials being deposited. For example to form a silicon nitride layer, the deposition processes of the cycles may alternate between depositing silicon and nitrogen. The purge process for each of the cycles is used to remove material from the deposition chamber before the subsequent cycle is performed.

One type of ALD process is a Plasma-Enhanced Atomic Layer Deposition Process (PEALD). For a PEALD process, each cycle includes a plasma treatment process followed by a post-plasma purge process. The plasma treatment process provides a number of benefits to improve the quality of the ALD process. However, the plasma treatment process can increase the charge within the wafer. The excessive charge on the wafer may adversely affect subsequent processing steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
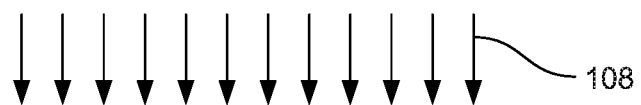
FIGS. 1A-1D are diagrams showing various steps within a layer deposition cycle, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, a PEALD process may result in excessive charge on the wafer. This excessive charge may adversely affect subsequent processing steps. To address this issue, the present disclosure is directed to a PEALD method that reduces the charge left on the wafer. In one example, instead of performing the plasma treatment process during every cycle, the plasma treatment process is not performed in every process. For example, the plasma treatment process may only be performed in 50 out of 800 cycles. Additionally or alternatively, in some examples, the post-plasma treatment purge step may be extended for some cycles.

FIGS. 1A-1D are diagrams showing various steps within a layer deposition cycle. Each cycle in a PEALD deposition process forms a single monolayer 104 on a substrate 102. The monolayer 104 may be, for example, one of two materials used to form a thin film on the substrate. For example, the monolayer may be nitrogen in the example where the thin film to be formed is a silicon nitride film.

FIG. 1A illustrates a deposition process 108 that deposits a single monolayer 104 on the substrate. The substrate 102 may be, for example, a silicon substrate. In some examples, the substrate may include other components of an integrated circuit. For example, thin film depositions may be deposited onto transistor components such as source/drain regions or gate devices. The thin film may be used for a variety of purposes such as hard masks used in photolithographic processes.

For each deposition process, the substrate 102 is exposed to a precursor gas. The gas includes the material to be deposited. For example, if nitrogen is to be deposited on the surface of the substrate 102, then the precursor gas includes nitrogen. The deposition process continues until a point after which all reactive sites on the surface of the substrate are consumed. Thus, only a single monolayer is formed. Each subsequent cycle alternates between two different types of material to be deposited using two different precursors. The two different precursors are thus not in the same chamber at the same time. Each monolayer 104 may have a thickness 106 of about 0.5 angstroms. The deposition process 108 may be applied for a period of time that is less than one second. In one example the deposition process 108 may be applied for about 0.3 seconds.

Figure 1B:
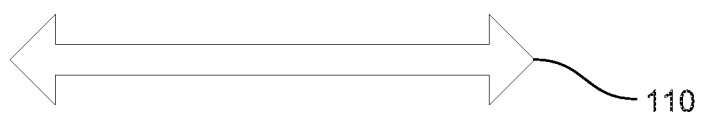

FIG. 1B illustrates a post-deposition purge process 110. The post-deposition purge process removes the extraneous precursor gas from the chamber. Because each layer deposition cycle alternates between different deposition materials, the precursor gas for each cycle's deposition process 108 is removed before a subsequent cycle is performed. In some examples, the post-deposition purge process 110 is applied for approximately 1 second.

Figure 1C:
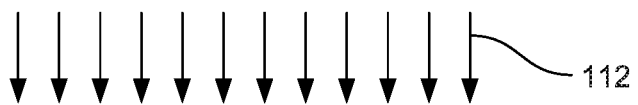
Figure 1C:
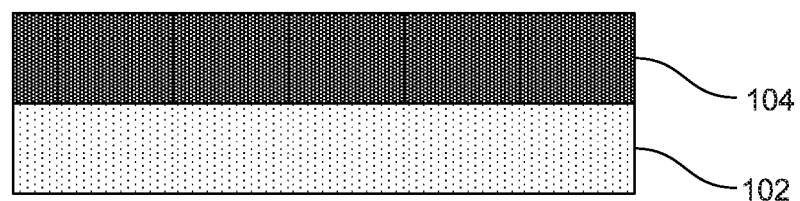

FIG. 1C is a diagram showing a plasma treatment process 112. The plasma treatment process 112 involves the application of an electromagnetic field to direct charged ions at the surface of the substrate. The plasma treatment process 112 may help densify the deposited monolayer 104 and increase the quality of the deposition process. The plasma treatment process 112 may be applied within a time range of about 3-4 seconds. In one example, the plasma treatment process is applied for 3.3 seconds.

Figure 1D:
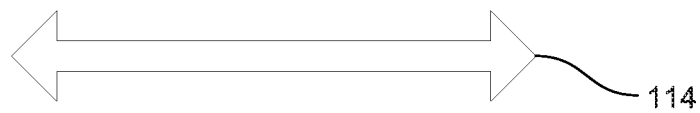
Figure 1D:
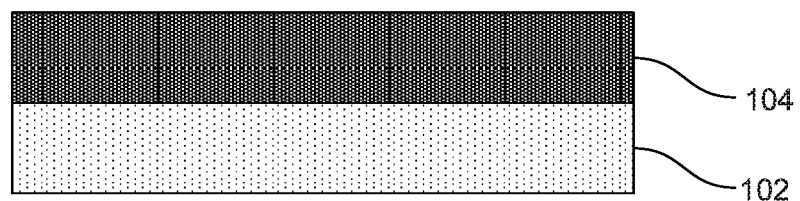

FIG. 1D is a diagram showing a post-treatment purge process 114. The post-deposition purge process removes the ionized gas from the chamber before the next layer deposition cycle is performed. The post-deposition process may sometimes be applied for about 0.3 seconds. In some cases, the post-deposition process may be applied for a time period within a range of about 2-5 seconds.

As will be described in further detail below, some layer deposition cycles may include a plasma treatment process 112 and a post-treatment purge process 114. However, some layer deposition cycles may not include such processes. Additionally, different layer deposition cycles may have an elongated time period for applying the post-treatment purge process.

Figure 2A:
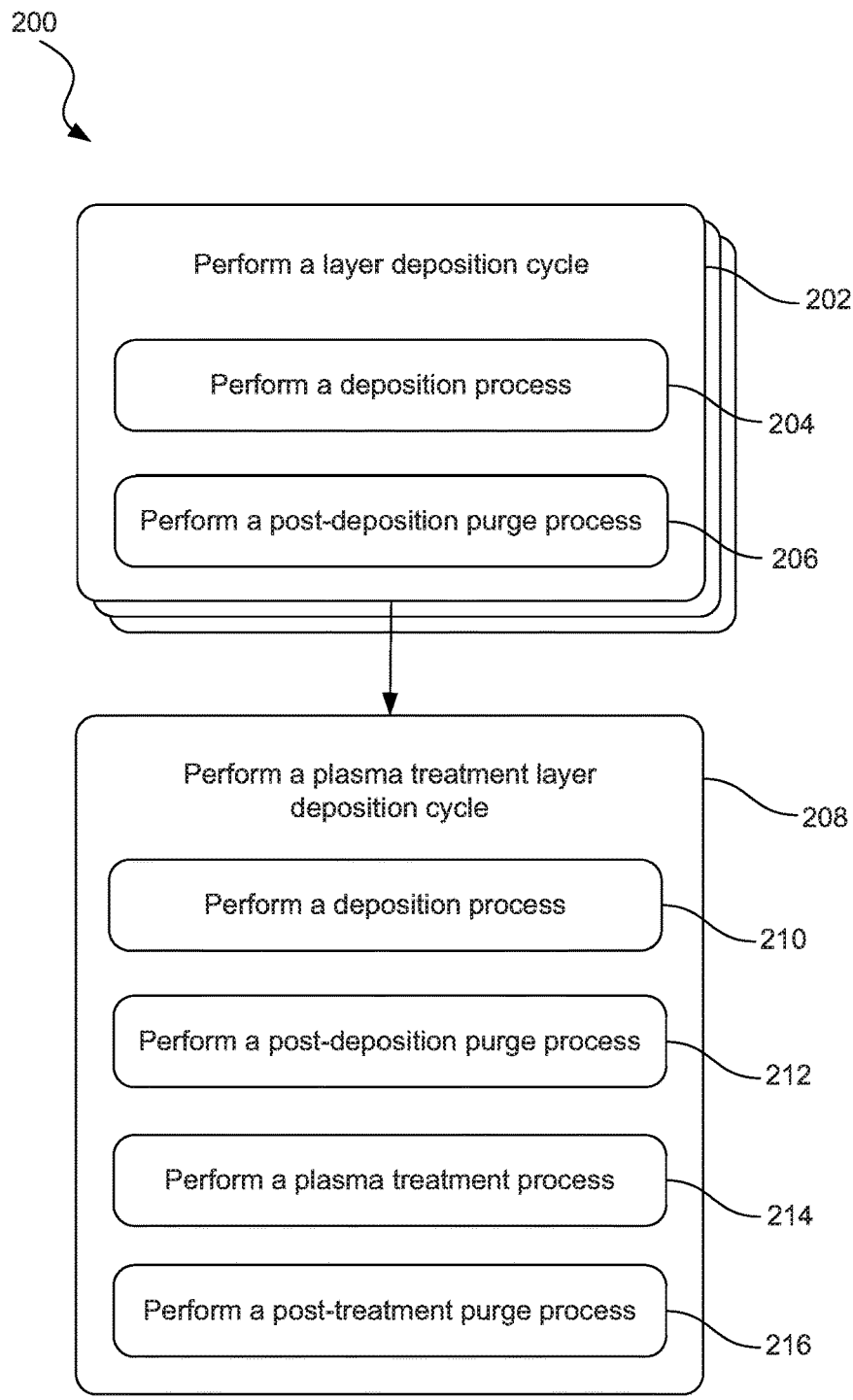
FIG. 2A is a flowchart showing layer deposition cycles that vary in use of plasma treatment processes, according to one example of principles described herein.

FIG. 2A is a flowchart 200 showing cycle variations in a PEALD process. In the present example, there are two different types of cycles. The first type of cycle will be referred to as a layer deposition cycle 202. The second type of cycle will be referred to as a plasma enhanced layer deposition cycle 208.

The layer deposition cycle 202 includes a deposition process 204 and a post-deposition purge process 206. As described above, during the deposition process 204, a precursor gas is flowed into the chamber of the tool performing the PEALD process. The precursor gas includes one of at least two different materials used to form the thin film deposition process. For example, if a silicon nitride film is to be formed, the precursor gas will include either nitrogen or silicon, but not both. Subsequent cycles will alternate between different types of precursor gas. During the post-deposition purge process 206, the precursor gas from the previous deposition process is purged from the chamber.

The plasma enhanced cycle 208 includes a deposition process 210, a post-deposition purge process 212, a plasma treatment process 214, and a post-treatment purge process 216. The deposition process 210 of the plasma enhanced layer deposition cycle 208 may be similar to that of the deposition process 204 for the layer deposition cycle 202. Likewise, the post-deposition purge process 212 of the plasma enhanced layer deposition cycle 208 may be similar to the post-deposition purge process 206 of the layer deposition cycle 202.

As described above, the plasma treatment process 214 involves flowing a gas into the chamber with charged ions. An electromagnetic field is then applied to direct the ions toward the substrate. The plasma treatment process may help densify the material deposited onto the wafer and may allow the deposition process to be performed at a lower temperature.

The post-treatment purge process 216 removes the ionized gas from the chamber before the next layer deposition cycle is performed. The post-deposition purge process 216 may sometimes be applied for about 0.3 seconds. In some cases, the post-deposition purge process 216 may be applied for a time that is less than 1 second. Turning the electromagnetic field on and off throughout the multiple cycles may build up a charge on the wafer.

Figure 2B:
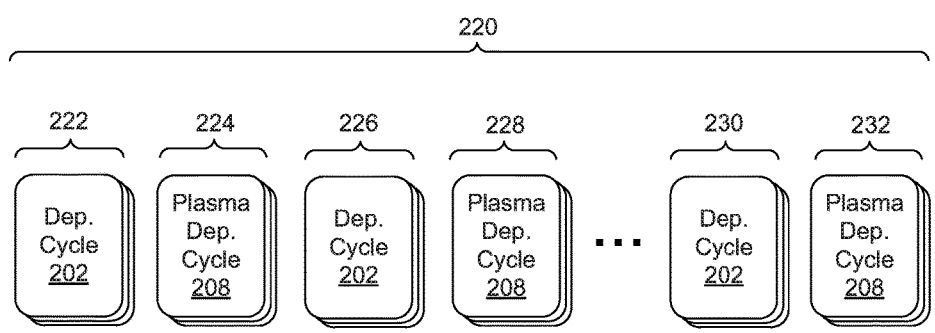
FIG. 2B is a diagram showing sets of layer deposition cycles that vary in use of plasma treatment processes, according to one example of principles described herein.

FIG. 2B is a diagram showing various sets 222, 226, and 230 of layer deposition cycles 202 and sets 224, 228, 232 of plasma enhanced layer deposition cycles 208 within a PEALD deposition process 220. In some examples, the PEALD deposition process 220 is designed to produce a thin film of material, such as silicon nitride, that has a thickness within a range of 30-50 nanometers. In some examples, each layer deposition cycle 202 deposits a layer of material that is about 0.5 angstroms thick. Thus, the total number of cycles in the deposition process 220 may be within a range of about 600-1000.

In the present example, a first set 222 of layer deposition cycles 202 is performed. After the first set 222 of layer deposition cycles is performed, a first set 224 of plasma enhanced layer deposition cycles 208 is performed. Each set of plasma enhanced layer deposition cycles 208 may include one or more cycles. The process may then be repeated. Specifically, a second set 226 of layer deposition cycles 202 may be performed, and afterwards, a second set 228 of plasma enhanced layer deposition cycles 208 may be performed. This process may continue until an nth set 230 of layer deposition cycles 208 is performed and an nth set 232 of plasma enhanced layer deposition cycles 208 is performed.

The number of layer deposition cycles 202 performed in a particular set 222, 226, 230 may be based on a predefined thickness to be formed by the particular set 222, 226, 230 of layer deposition cycles 202. For example, the number of layer deposition cycles 202 within the first set 222 may be sufficient to form a layer having a thickness within a range of 1-4 nanometers. In some examples, the number of layer deposition cycles 202 within the first set 222 may be sufficient to form a layer having a thickness within a range of 2-3 nanometers. Other ranges are contemplated as well.

In some examples, the number of layer deposition cycles 202 performed in a particular set 222, 226, 230 may be based on a predefined number of cycles. For example, the number of layer deposition cycles 202 within a set may be within a range of 20-80 cycles. In some examples, the number of layer deposition cycles 202 within a set may be within a range of 40-60 cycles. Other numbers of cycles are contemplated as well.

In some examples, the number of layer deposition cycles 202 within each set 222, 226, 230 may be similar throughout the entire deposition process 220. For example, each set of layer deposition cycles 202 may include 40 cycles. In some examples, the sets 222, 226, 230 of layer deposition cycles for the entire deposition process 220 may have a different number of cycles. For example, the first set 222 of layer deposition cycles 202 may include 30 cycles and the second set 226 of layer deposition cycles may include 45 cycles. In other words, the plasma enhanced layer deposition cycles 208 may be positioned randomly within the entire total sequence of cycles for a particular deposition process 220.

In some examples, there may be only a single plasma enhanced layer deposition cycle 208 in the plasma enhanced layer deposition cycle sets 224, 228, 232. In some examples, however, the plasma enhanced layer deposition cycle sets 224, 228, 232 may include a plurality of cycles. For example, instead of a single plasma enhanced layer deposition cycle 208 between the first set 222 and the second set 226, there may be three plasma enhanced layer deposition cycles 208 between the first set 222 and the second set 226. Other numbers of plasma enhanced layer deposition cycles 208 are also contemplated. In some examples, the number of plasma enhanced layer deposition cycles 208 in the sets 224, 228, 232 may include a different number of cycles. For example, the first plasma enhanced layer deposition cycle set 224 may include two plasma enhanced layer deposition cycles 208 and the second plasma enhanced layer deposition cycle set 228 may include four plasma enhanced layer deposition cycles 208. In some examples, a ratio of total number of layer deposition cycles of the deposition process to a total number of plasma enhanced layer deposition cycles of the deposition process is within a range of 20:1 to 5:1.

Figure 3:
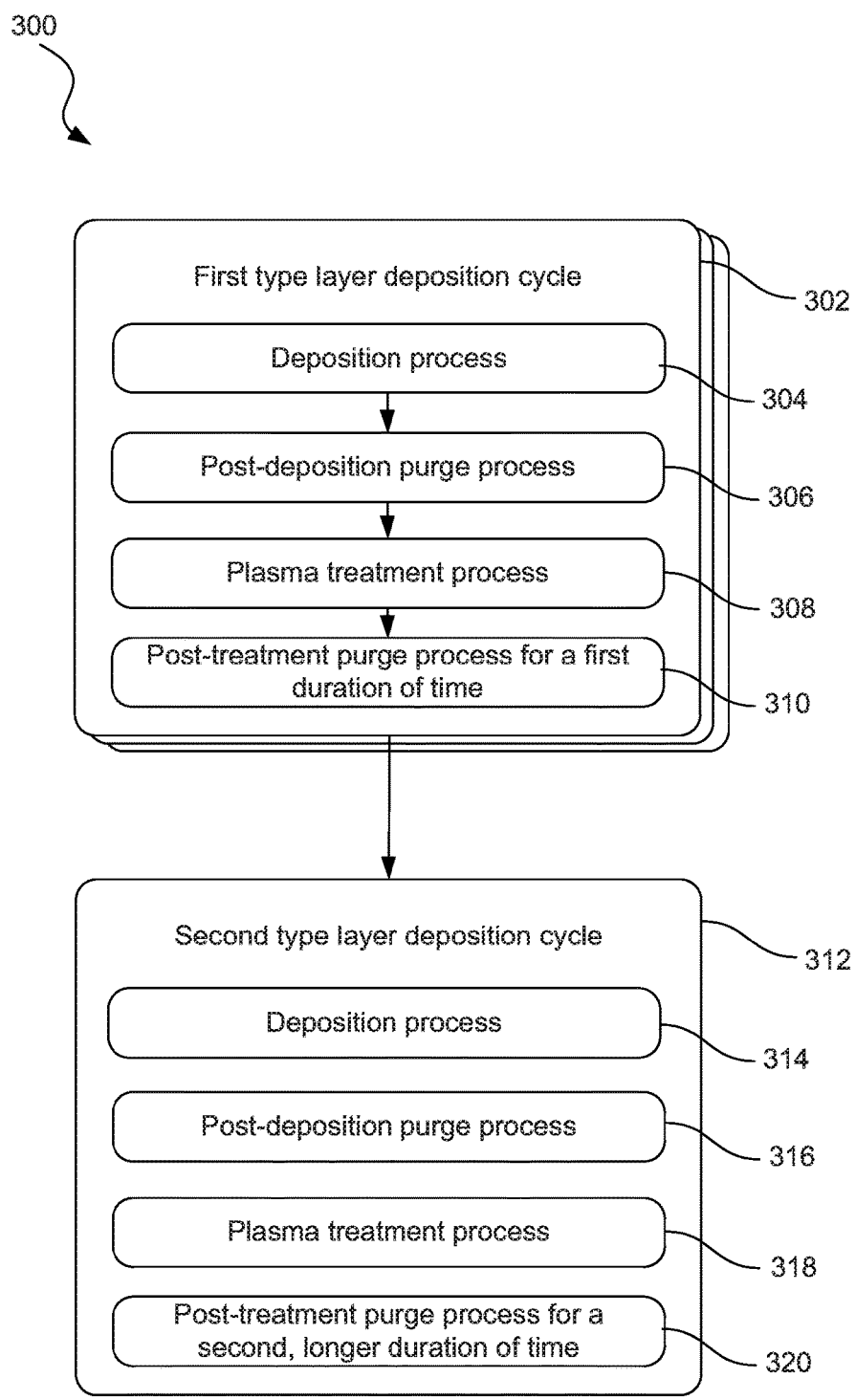
FIG. 3 is a flowchart showing layer deposition cycles that vary in plasma treatment process time, according to one example of principles described herein.

FIG. 3 is a flowchart 300 showing cycle variations in a PEALD process. According to the present example, there is a first type of layer deposition cycle 302 and a second type of layer deposition cycle 312. The first type of layer deposition cycle 302 includes a deposition process 304, a post-deposition purge process 306, a plasma treatment process 308, and a post-treatment purge process 310. The post-treatment purge process 310 is applied for a first duration of time.

Similar to the deposition steps described above, the deposition step 304 includes flowing a precursor gas into the chamber of the tool performing the PEALD process. The precursor gas includes one of at least two different materials used to form the thin film deposition process. For example, if a silicon nitride film is to be formed, the precursor gas will include either nitrogen or silicon, but not both. Subsequent cycles will alternate between different types of precursor gas. During the post-deposition purge process, the precursor gas from the previous deposition process is purged from the chamber.

Similar to the purge processes described above, the purge process 306 removes the extraneous precursor gas from the chamber. Because each layer deposition cycle alternates between different deposition materials, the precursor gas for each cycle's deposition process is removed before a subsequent cycle is performed. In some examples, the post-deposition purge process is applied for approximately 1 second.

Similar to the plasma treatment processes described above, the plasma treatment process 308 removes the ionized gas from the chamber before the next layer deposition cycle is performed. The post-treatment purge process 310 may be similar to other purge processes described above. The post-treatment purge process 310 may be applied for a first duration of time. In one example, the duration of time may be less than one second. In some examples, the duration of time may be less than 0.5 seconds. In some examples, the duration of time may be about 0.3 seconds.

The second type of layer deposition cycle 312 includes a deposition process 314, a post-deposition purge process, a plasma treatment process 318, and a post-treatment purge process 320. The post-treatment purge process 320 is performed for a second duration of time that is longer than the first duration of time.

Similar to the deposition steps described above, the deposition process 314 includes flowing a precursor gas into the chamber of the tool performing the PEALD process. The precursor gas includes one of at least two different materials used to form the thin film deposition process. For example, if a silicon nitride film is to be formed, the precursor gas will include either nitrogen or silicon, but not both. Subsequent cycles will alternate between different types of precursor gas. During the post-deposition purge process, the precursor gas from the previous deposition process is purged from the chamber.

Similar to the purge processes described above, the purge process 316 removes the extraneous precursor gas from the chamber. Because each layer deposition cycle alternates between different deposition materials, the precursor gas for each cycle's deposition process is removed before a subsequent cycle is performed. In some examples, the post-deposition purge process is applied for approximately 1 second.

Similar to the plasma treatment processes described above, the plasma treatment process 308 removes the ionized gas from the chamber before the next layer deposition cycle is performed. The post-treatment purge process 320 may be applied for a second duration of time that is longer than the first duration of time. In one example, the second duration of time may be greater than one second. In some examples, the second duration of time may be greater than 2 seconds. In some examples, the second duration of time may be within a range of about 2-5 seconds. By occasionally extending the length of the post-plasma treatment purge process, the charge on the wafer after the entire deposition process may be reduced. This may lead to higher quality devices and better yield.

Figure 4:
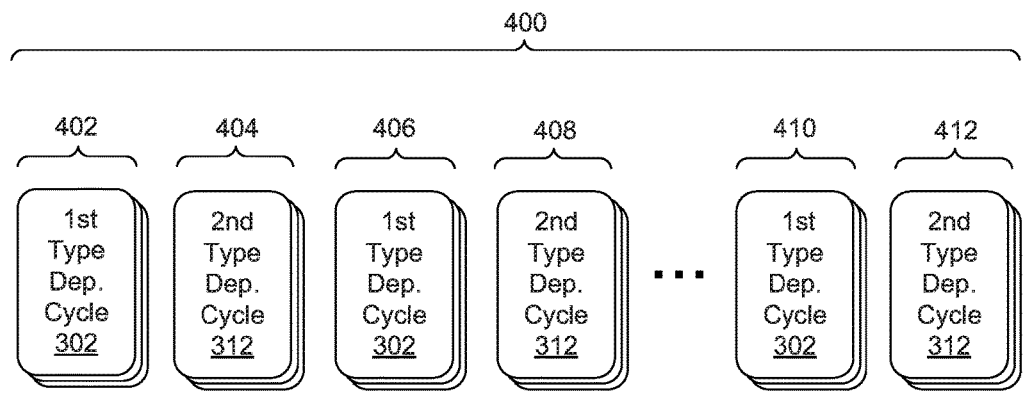
FIG. 4 is a diagram showing layer deposition cycles that vary in plasma treatment process time, according to one example of principles described herein.

FIG. 4 is a diagram showing cycle variations in a PEALD deposition process 400. In some examples, the PEALD deposition process 400 is designed to produce a thin film of material, such as silicon nitride, that has a thickness within a range of 30-50 nanometers. In some examples, each layer deposition cycle 302 deposits a layer of material that is about 0.5 angstroms thick. Thus, the total number of cycles in the deposition process 400 may be within a range of about 600-1000.

In the present example, a first set 402 of first type layer deposition cycles 302 is performed. After the first set 402 of first type layer deposition cycles is performed, a first set 404 of second type layer deposition cycles 312 is performed. The process may then be repeated. Specifically, a second set 406 of first type layer deposition cycles 302 may be performed, and afterwards, a second set 408 of second type layer deposition cycles 312 may be performed. This process may continue until an nth set 410 of first type layer deposition cycles 302 is performed and an nth set 423 of second type layer deposition cycles 312 is performed.

The number of first type layer deposition cycles 302 performed in a particular set 402, 406, 410 may be based on a predefined thickness to be formed by the particular set of layer deposition cycles 202. For example, the number of layer deposition cycles 302 within the first set 404 may be sufficient to form a layer having a thickness within a range of 1-4 nanometers. In some examples, the number of layer deposition cycles 302 within the first set 404 may be sufficient to form a layer having a thickness within a range of 2-3 nanometers. Other ranges are contemplated as well.

In some examples, the number of first type layer deposition cycles 302 performed in a particular set 402, 406, 410 may be based on a predefined number of cycles. For example, the number of first type layer deposition cycles 402 within a set may be within a range of 20-80 cycles. In some examples, the number of first type layer deposition cycles 302 within a set 402, 406, 410 may be within a range of 40-60 cycles. In some examples, the sets 402, 406, 410 may have a smaller number of cycles, such as 4, 10, or 16 cycles. Other numbers of cycles are contemplated as well.

In some examples, the number of first type cycles 402 within each set 402, 406, 410 may be similar throughout the entire deposition process 400. For example, each set of layer deposition cycles 302 may include 40 cycles. In some examples, the sets 402, 406, 410 of first type cycles for the entire deposition process 400 may have a different number of cycles. For example, the first set 402 of first type layer deposition cycles 302 may include 30 cycles and the second set 406 of first type layer deposition cycles may include 45 cycles. In other words, the sets 404, 408, and 412 of second type layer deposition cycles 312 may be positioned randomly within the entire total sequence of cycles for a particular deposition process 400. In some examples, the total number of second type cycles 312 for a particular deposition process may be one of: 50, 100, or 200.

In some examples, there may be only a single second type cycle 312 in each of the sets 404, 408, 412. In some examples, however, the sets 404, 408, 412 of second type cycles 312 may include a plurality of cycles. For example, instead of a single second type layer deposition cycle 302 in the first set 404, there may be three second type layer deposition cycles 312 in the second set 408. Other numbers of second type layer deposition cycles 312 are also contemplated. In some examples, the number of second type layer deposition cycles 312 in each of the sets 404, 408, 412 may be different. For example, the first set 404 of second type layer deposition cycles 312 may include two second type layer deposition cycles 312 and the second set 408 may include one second type layer deposition cycle 312.

Figure 5:
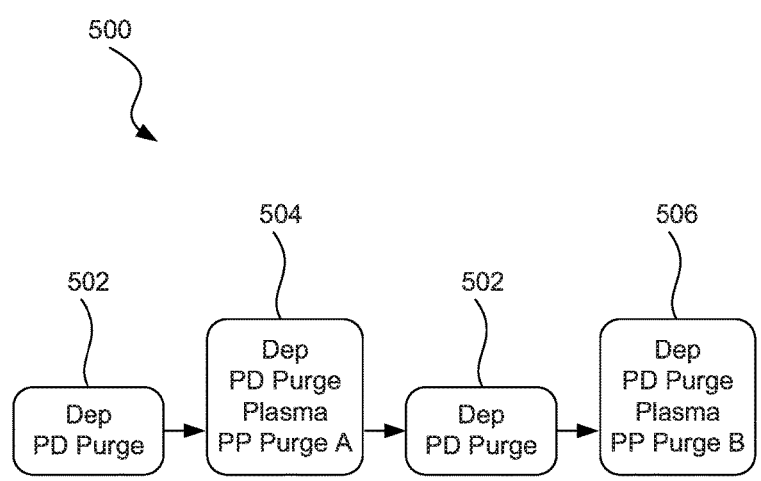
FIG. 5 is a diagram showing layer deposition cycles that vary in use of plasma treatment processes plasma treatment process time, according to one example of principles described herein.

FIG. 5 is a diagram showing layer deposition cycles that differ in use of plasma treatment and time of plasma treatment. In this example, there are three different types of layer deposition cycles for a particular deposition process 500. Specifically, the first type 502 of layer deposition cycle includes a deposition process and a post-deposition purge process. Thus, the first type 502 of layer deposition cycle does not include a plasma treatment process.

The second type of 504 of layer deposition cycle includes a deposition process, a post-deposition purge process, a plasma treatment process, and a post-plasma purge process. The post-plasma purge process for the second type of layer deposition cycle is applied for a first duration of time. The first duration of time may be about 0.3 seconds. In some examples, the first duration of time may be within a range of 0.1-1 seconds.

The third type 506 layer deposition cycle includes a deposition process, a post-deposition purge process, a plasma treatment process, and a post-plasma purge process. The post-plasma purge process for the third type of layer deposition cycle is applied for a second duration of time. The second duration of time is longer than the first duration of time. In some examples, the second duration of time may be greater than 1 second. In some examples, the second duration of time may be greater than 2 seconds. In some examples, the second duration of time may be within a range of 2-5 seconds.

In some examples, a deposition process may proceed by alternating between sets of second type 504 and third type 506 layer deposition cycles with sets of first type 502 layer deposition cycles in between each second and third type cycle set as illustrated. Other orders are contemplated as well.

Figure 6:
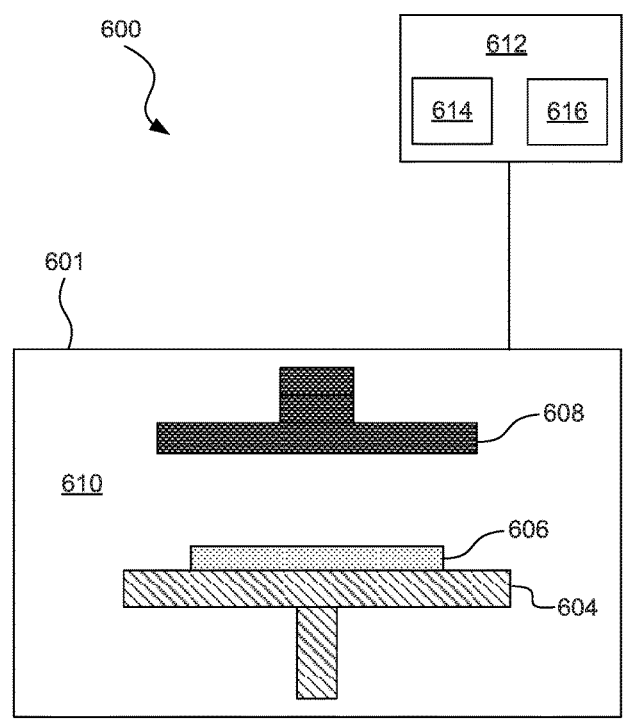
FIG. 6 is a diagram showing an illustrative system for performing a PEALD process with cycle variations, according to one example of principles described herein.

FIG. 6 is a diagram showing an illustrative system 600 for performing a PEALD process with cycle variations. According to the present example, the system 600 includes a PEALD fabrication tool 601 and a control system 612. The PEALD fabrication tool 601 includes a deposition chamber 610, a wafer stage 604, and a plasma tool 608.

The deposition chamber 610 is a space designed to hold the wafer stage 604 and the plasma tool. The deposition chamber 610 may be in fluid communication with gas sources in order to provide various precursor gases to the chamber 610 for the deposition processes described above. The deposition chamber 610 may also be in fluid communication with a negative pressure or vacuum in order to purge gas from the chamber for the purge processes described above.

The wafer stage 604 is designed to hold and secure a wafer 606 during fabrication processes. The wafer 606 may be robotically placed on the wafer stage 604 before the deposition process and robotically removed after the deposition process. The plasma treatment tool 608 may be used to apply an electromagnetic field to direct ions within an ionized gas at the wafer 606.

The control system 612 controls and directs the fabrication tool to start and stop various processes involved in the PEALD deposition process. The control system 612 includes a processor 614 and a memory 616. The memory 616 includes machine readable instructions that when executed by the processor 614, cause the control system 612 to send command signals to the fabrication tool 601. The command signals may instruct the fabrication tool to perform the various deposition processes and cycles described above.

According to one example, a process includes performing a first plurality of layer deposition cycles of a deposition process on a substrate, and after performing the first plurality of layer deposition cycles, performing a plasma enhanced layer deposition cycle comprising a plasma treatment process. The first plurality of layer deposition cycles are performed without a plasma treatment process.

According to one example, a deposition process includes performing a first plurality of plasma enhanced atomic layer deposition (PEALD) cycles on a substrate, the first plurality of cycles including, performing a purge process for a first time duration, and after performing the first plurality of layer deposition cycles, performing a charge relief layer deposition cycle. The charge relief layer deposition cycle includes performing a plasma treatment process and performing a post-plasma-treatment purge process for a second time duration that is greater than the first time duration.

A system includes a Plasma Enhanced Atomic Layer Deposition (PEALD) fabrication tool and a control system in communication with the PEALD fabrication tool. The control system includes a processor and a memory with machine readable instructions that when executed by the processor, cause the PEALD fabrication tool to perform a first plurality of plasma enhanced atomic layer deposition (PEALD) cycles on a substrate and after the first plurality of layer deposition cycles are performed, perform a plasma enhanced layer deposition cycle comprising a plasma treatment process. The first plurality of layer deposition cycles are performed without the plasma treatment process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a first plurality of layer deposition cycles of a deposition process on a substrate, each of the first plurality of layer deposition cycles having a purge process of a first duration of time; and
after performing the first plurality of layer deposition cycles, performing a plasma enhanced layer deposition cycle comprising a plasma treatment process, the plasma enhanced layer deposition cycle comprising a purge process of a second duration of time that is longer than the first duration of time;
wherein the first plurality of layer deposition cycles are performed without a plasma treatment process.

2. The method of claim 1, further comprising, after performing the plasma enhanced layer deposition cycle, performing a second plurality of layer deposition cycles, the second plurality of layer deposition cycles being without a plasma treatment process.

3. The method of claim 1, wherein the first plurality of layer deposition cycles comprises a number within a range of 20-80 of cycles.

4. The method of claim 1, wherein the first plurality of layer deposition cycles forms a film having a thickness within a range of 1-4 nanometers.

5. The method of claim 1, wherein a ratio of total number of layer deposition cycles of the deposition process to a total number of plasma enhanced layer deposition cycles of the deposition process is within a range of 20:1 to 5:1.

6. The method of claim 1, wherein the second duration of time is within a range of about 2-5 seconds.

7. The method of claim 1, wherein the plasma enhanced layer deposition cycle comprises:
depositing material on the substrate;
performing a first chamber purge process;
performing the plasma treatment process; and
performing a second chamber purge process.

8. The method of claim 1, wherein the first duration of time is less than 1 second.

9. The method of claim 1, wherein the first duration of time is about 0.3 seconds.

10. A method for performing a deposition process, the method comprising:
performing a first plurality of plasma enhanced atomic layer deposition (PEALD) cycles on a substrate, the first plurality of cycles comprising:
performing a purge process for a first time duration; and
after performing the first plurality of layer deposition cycles, performing a charge relief layer deposition cycle comprising:
performing a plasma treatment process; and
performing a post-plasma-treatment purge process for a second time duration that is greater than the first time duration.

11. The method of claim 10, wherein the first time duration is about 0.3 seconds and the second time duration is within a range of about 2-5 seconds.

12. The method of claim 10, wherein a total number of the charge relief layer deposition cycles in the deposition process is one of: 50, 100, and 200.

13. The method of claim 10, wherein each of the first plurality of layer deposition cycles further comprises:
depositing material on the substrate; and
after depositing the material, performing the purge process.

14. The method of claim 10, wherein the first plurality of layer deposition cycles comprises a number within a range of 20-80 of cycles.

15. The method of claim 10, wherein the first plurality of layer deposition cycles forms a thin film having a thickness within a range of 1-4 nanometers.

16. A system comprising:
a Plasma Enhanced Atomic Layer Deposition (PEALD) fabrication tool; and
a control system in communication with the PEALD fabrication tool, the control system comprising:
a processor; and
a memory with machine readable instructions that when executed by the processor, cause the PEALD fabrication tool to:
perform a first plurality of layer deposition cycles on a substrate, the first plurality of layer deposition cycles having a purge process of a first time duration; and
after the first plurality of layer deposition cycles are performed, perform a plasma enhanced layer deposition cycle comprising a plasma treatment process, the plasma enhanced layer deposition cycle having a purge process of a second time duration that is longer than the first time duration;
wherein the first plurality of layer deposition cycles are performed without the plasma treatment process.

17. The system of claim 16, wherein the first time duration is less than 1 second.

18. The system of claim 16, wherein the second time duration is about 0.3 seconds.

* * * * *